United States Patent
Frenkel et al.

(10) Patent No.: US 9,352,544 B2
(45) Date of Patent: May 31, 2016

(54) PROCESS FOR DRY-COATING FLEXOGRAPHIC SURFACES

(75) Inventors: Moshe Frenkel, Jerusalem (IL); Michael Letuchi, Netanya (IL); Artem Zhilin, Yanuv (IL); Yacov Mazuz, Rishon Le'Zion (IL)

(73) Assignee: DIGIFLEX LTD., Kfar Saba (IL)

( * ) Notice: Subject to any disclaimer, the term of this patent is extended or adjusted under 35 U.S.C. 154(b) by 0 days.

(21) Appl. No.: 14/239,833

(22) PCT Filed: Aug. 23, 2012

(86) PCT No.: PCT/IL2012/050323
§ 371 (c)(1),
(2), (4) Date: Jun. 2, 2014

(87) PCT Pub. No.: WO2013/027220
PCT Pub. Date: Feb. 28, 2013

(65) Prior Publication Data
US 2014/0290520 A1    Oct. 2, 2014

Related U.S. Application Data

(60) Provisional application No. 61/526,952, filed on Aug. 24, 2011.

(51) Int. Cl.
| | | |
|---|---|---|
| *B41F 33/00* | (2006.01) | |
| *B41F 5/24* | (2006.01) | |
| *G03F 7/11* | (2006.01) | |
| *G03F 7/16* | (2006.01) | |
| *G03F 7/20* | (2006.01) | |
| *B41F 23/00* | (2006.01) | |
| *B41M 5/52* | (2006.01) | |

(52) U.S. Cl.
CPC . *B41F 5/24* (2013.01); *B41F 23/00* (2013.01); *B41M 5/5254* (2013.01); *G03F 7/11* (2013.01); *G03F 7/161* (2013.01); *G03F 7/2018* (2013.01)

(58) Field of Classification Search
CPC .......... B41P 2200/21; B41F 5/24; G03F 7/11; G03F 7/161; G03F 7/2018
See application file for complete search history.

(56) References Cited

U.S. PATENT DOCUMENTS

| | | |
|---|---|---|
| 4,389,480 A | 6/1983 | Franke et al. |
| 4,927,709 A | 5/1990 | Parker et al. |
| 6,358,668 B1 | 3/2002 | Leenders et al. |
| 2002/0046668 A1 | 4/2002 | Bell et al. |
| 2003/0143473 A1 | 7/2003 | Goto |
| 2004/0244643 A1 | 12/2004 | Voeght et al. |
| 2006/0073417 A1* | 4/2006 | Hermesdorf .................. 430/302 |
| 2006/0075917 A1 | 4/2006 | Edwards |
| 2007/0212647 A1 | 9/2007 | Takagi et al. |

FOREIGN PATENT DOCUMENTS

| | | |
|---|---|---|
| EP | 0 854 389 A1 | 7/1998 |
| EP | 1 239 329 A2 | 9/2002 |

(Continued)

OTHER PUBLICATIONS

The International Search Report and Written Opinion for International Application No. PCT/IL2012/050323, 18 pages, mailed Apr. 22, 2013.

*Primary Examiner* — Matthew G Marini
(74) *Attorney, Agent, or Firm* — Vorys, Sater, Seymour & Pease LLP

(57) ABSTRACT

Provided is a process for dry, solvent free, transfer of solid material onto a flexographic plate.

15 Claims, 2 Drawing Sheets

(56) References Cited

FOREIGN PATENT DOCUMENTS

| | | | |
|---|---|---|---|
| EP | 1 637 322 | A2 | 3/2006 |
| JP | 2006-82539 | A | 3/2006 |
| WO | 2005/106597 | A2 | 11/2005 |
| WO | 2010/086850 | A2 | 8/2010 |

* cited by examiner

PROCESS FOR DRY-COATING FLEXOGRAPHIC SURFACES

FIELD OF THE INVENTION

This invention generally relates to a process for the transfer of solid material onto flexographic plate surfaces.

BACKGROUND OF THE INVENTION

Flexo is the best suitable and versatile method for printing on a wide range of materials for a variety of applications, such as rolled or flat-rigid and soft/deformable/flexible substrates, corrugated cardboard, foils, plastics film, aluminum foils, label materials, newsprint and more.

Modern flexography is a process that uses polymeric relief plates. The plate is coated by a film image mask, which is prepared separately and then attached to the virgin plate. The negative mask areas absorb and block UV light, while the transparent, positive, image-areas on the plate are exposed to the UV light through the mask and cured thereby. The plate then goes through a development process where the negative masked unexposed areas are etched away, leaving only the impression/cured printing ink holder-surface that later carries the printing ink and transfers it directly to the printed substrate material during the printing process.

The traditional method of preparing a flexo plate master through a film mask is a complex process which includes a plurality of steps, a variety of devices and is time consuming. The main step in such methods involves the direct application of a liquid formulation directly onto the flexographic plate. These available liquid coating techniques suffer, among others, from the following deficiencies:

1. The liquid coating methods employ a liquid solvent, which is most often volatile and toxic and may cause environmental contamination. Additionally, only a limited number of solvents may be used in the primer formulation, as improper selection of solvent can damage the flexographic plate surface;
2. The solubility of the coating materials in the desired solvent might be limited, thereby limiting choice of solvents;
3. The liquid coating methods require high temperatures for drying the coated film on top of the flexographic plate, causing photopolymer deformation and polymerization. When employed at a low temperature, a homogenous and uniform film coating is not typically obtained;
4. In the liquid coating methods for coating a single photopolymeric plate (vis-à-vis continuous coating technology), coating uniformity, homogeneity, stability and other surface mechanical characteristics are very difficult to control and maintain, especially at the plate edges; and
5. The liquid coating methods are cost ineffective.

Therefore, there is a demand to replace the available wet-coating processes for coating flexographic plates with shorter make-ready time (on demand), economically/simple, more environmentally friendly and more efficient process, which would overcome the aforementioned deficiencies associated with wet processes, maintain or increase the quality characteristics of traditional flexo printing processes and which will permit industrial and continuous material-efficient process.

REFERENCES

[1] US application no. 2006/0073417;
[2] U.S. Pat. No. 6,358,668;
[3] US application no. 2007/0212647.

SUMMARY OF THE INVENTION

It is the purpose of the present application to provide a superior process to the currently employed wet-coating processes for coating flexographic plates, to enable imaging of the plates by e.g., ink-jet technology and the bi-component ink approach. The process of the present invention, which enables the transfer of a dry coat onto such unique surfaces, dramatically improves the overall mask/plate/print quality on a variety of plate sizes and plate materials, increases machine reliability, reduces machine costs, simplifies maintenance, enables cost effective short runs, minimizes volatile organic compounds (VOC) emission and may thus be regarded environmentally friendly.

Thus, in one aspect of the present invention, there is provided a dry, solvent free, process for the transfer of an ink receptive coating (a solid material film) to at least a region of a flexographic material surface (used interchangeably with flexographic plate), thereby forming a coat (film) of the ink receptive material on at least a region of said flexographic material surface. The film transferred onto said at least a region of the flexographic material surface is of a material composition selected to enable full and effective transfer of the solid film from a sacrificial surface onto the flexographic plate and also to permit a chemical reaction of the solid film, having been transferred onto the flexographic plate surface, with an ink-jet ink droplet printed thereon, to cause the freezing of the ink droplet and enable high quality imaging, e.g., via a chemical reaction.

The process of the invention provides an efficient alternative to the currently available methods of liquid coatings of flexographic plates, and overcomes the deficiencies noted above.

In the process of the invention, the ink receptive solid film is first formed on a sacrificial surface, to better control the film mechanical characteristics. At this stage, the film may also be manipulated, as needed, so as to enable transfer of a film which complies with all prerequisites defined for e.g., ink-jet printing, without risking damaging the more expensive and easily-damaged flexographic plate. Similarly, as the film is transferred from the sacrificial substrate onto the flexographic surface solvent-free and under mild conditions, i.e., temperature and pressure, the risk of damaging the flexographic plate is substantially reduced or diminished.

The ink receptive solid film having been transferred onto the flexographic plate surface contains the required materials to permit an eventual instantaneous reaction with an ink-jet droplet printed thereon. This reaction causes an immediate freezing of the droplet, yielding an extremely high image quality on top of the flexographic plate surface. The ink receptive solid film also contains chemical components which permit the adherence of the film to the flexographic surface. Thus, such a combination of ingredients ensures not only the formation of a fully adhered surface, but also a solid film which has the full characteristics required for formation of high quality images on said surface.

The process of the invention thus provides a solution to the various deficiencies associated with the direct solvent-based wet coating methods for coating flexographic plate surfaces and is a superior replacement technology to such solvent-based coating technologies.

In some embodiments, the process comprises:
(a) providing an ink receptive solid material film on a sacrificial surface (sheet), the film having a first face and a second face, said second face being covered by said sacrificial surface, the solid material film having the adhesion characteristic defined by Eq. 1, hereinbelow;
(b) bringing into contact at least a region of a flexographic material surface with the first face of said solid material film; and (c) permitting adhesion of said solid material film to said at least a region of the flexographic surface, such that the sacrificial surface (sheet) is in direct adhering contact to the second face of the solid material film and the flexographic material surface being in direct adhering contact to the first face of the solid film, thereby forming a layered structure characterized by the ink receptive solid material on at least a region of said flexographic material surface.

The process therefore results in the coating of the flexographic plate by an ink receptive solid material film (interchangeable with the term "dry coat") without the use of solvents, i.e. a dry, solvent free, transferring process.

The adhesion, namely the tendency of the surfaces to stick to one another, is carefully selected such that the adhesion (peeling) forces between the flexographic surface and the solid material film are larger than the adhesion (peeling) forces between the solid material film and the sacrificial surface. This reassures the transfer of the ink receptive solid material film from the sacrificial surface to the flexographic surface.

In some embodiments, the peeling force characterizing the adhesion of the ink receptive solid material to the sacrificial surface being between 0.01 and 0.6 Newton/inch.

In other embodiments, the peeling force characterizing the adhesion of the ink receptive solid material to the flexographic surface being between 0.25 and 45 Newton/inch.

In some embodiments, the delamination force associated with delaminating the flexographic plate (thus destructing the plate) is ca. 0.07 Newton/inch.

In still other embodiments of the invention, the ink receptive solid material film is characterized by the adhesion ratio presented in equation (Eq. 1):

$$\frac{\text{adhesion of the solid film to the flexographic surface}}{\text{adhesion of the solid film to the sacrificial surface}} > 3 \quad \text{Eq. 1}$$

The adhesion of the ink receptive film to the sacrificial surface is smaller than the delamination forces required for delaminating the flexographic surface.

In some embodiments, a protective layer is provided, covering the ink receptive solid material film coating used in step (a) of the process. This protective layer may remain on the first face of the ink receptive solid film until application of the process steps, namely until the bringing into contact the at least a region of a flexographic material surface and the first face of said solid material film. Similarly, the adhesive forces between the protective layer and the ink receptive solid material film should be designed to be significantly lower than the adhesive forces between the ink receptive solid material film and the sacrificial surface as to prevent de-lamination of the solid material film from the sacrificial surface upon removal of the protective layer therefrom.

In some embodiments, the process further provides for the full release (complete peeling off) of the sacrificial sheet from the ink receptive solid film in the above layered structure. Once the solid material film has adhered to the surface of the flexographic material, the sacrificial surface may be peeled off exposing the second surface (the back side) of said film. In some embodiments, particularly for the purposes of storage and product delivery, the sacrificial sheet may be kept on as a protective sheet (protect from e.g., mechanical damage) to be peeled off immediately prior to use.

The flexographic surface is, in most general terms, composed of a photopolymeric material, e.g., a polymer, oligomer or a monomer, which is photosensitive to UV and which upon exposure thereto polymerizes and/or cross-links to form a stable surface. Non-limiting examples of such flexographic materials are Nyloflex or Sprint plates, manufactured by Flint; Cyrel plates, manufactured by DuPont; plates manufactured by Tokyo Ohra kogyo Co.; Novacryl; Elaslon; and MAX photopolymeric plates manufactured by MacDermid.

In some embodiments, the flexographic surface is at least one surface of a substrate, said substrate may or may not itself be composed of a photopolymeric material. The flexographic surface, as the substrate itself, may be of any size and shape. In some embodiments, the photopolymeric material is in the form of a coating layer on top of at least one portion of a substrate. In further embodiments, the photopolymeric material is in the form of a sheet, when used as a protective layer (e.g., in PCB, being an etch mask) or when used in offset plates, and up to a thickness of few millimeters when used as a flexographic plate material.

In some embodiments, the flexographic surface is at least a surface portion of a printing plate, herein referred to as a "flexographic plate".

As demonstrated in FIG. 1A, in some embodiments, the ink receptive solid material film 104 coats at least a region of the flexographic surface, e.g., plate, 102. In this specific embodiment, the sacrificial surface 106 covers the top face of the solid material film. As detailed herein, said sacrificial surface 106 is thereafter typically removed, as depicted in FIG. 2, partially or wholly, exposing the ink receptive solid material film 104.

In some embodiments, said at least a region is continuous. In other embodiments, said region is two or more spaced-apart regions of the flexographic surface. In additional embodiments, said at least a region is the entire area of the flexographic surface.

The flexographic material is generally of three types: a water washable material; a solvent washable material; a letter-press plate material; or a thermally processed material. Some typical differences between the various plates include the following: water washable plates are composed of photopolymers which are water soluble (e.g. Torelief WF80DHX4); water dispersible (e.g. Cosmolight plates)—while solvent washable plates contain photopolymers which are dissolved using a mixture of e.g., perchloroethylene—butanol mixtures, as well as commercially available solvents. Water content in the plates differs from high water content in some plates (e.g. Toreleif plates), to low water content in other plates and down to zero water content in the solvent washable plates. This variance in water content in the plates largely affects the adhesion mechanism of the solid film to the flexographic plate. Plates also differ in their hardness, thickness and internal delamination strength.

Non-limiting examples of flexographic plates include: Now 1.14—available from DuPont; ACE 1.14—available from Flint; MAX 1.14 mm thick—available from MacDermid; Cyrel 45 FD2 1.14 mm thick—available from DuPont; Torelief WF80DHX4—made by Toray (Letter Press Plate); JetEurope LSL073SB—made by Jet Europe (Letter Press Plate); Miraclon B170E—made by Tokyo Ohka Kogyo Co. (Water-Flexo Plate); and Now 45—made by DuPont (solvent-Flexo Plate).

The ink receptive solid material film, which is transferred onto the flexographic surface in accordance with the process of the invention, is first formed (pre-formed) on a sacrificial polymeric substrate (cut into sheet), namely on a substrate (sheet) which plays no further role in the process, a substrate that is typically not flexographic in nature. The sacrificial substrate may be discarded or re-used.

The ink receptive solid material film (or solid material film), namely the film of a material to be transferred from the sacrificial plate to the flexographic plate, and which subsequently received the ink, is formed by wet-coating the sacrificial substrate with a liquid formulation, which may be solvent-based (e.g., organic solvent) or water-based, followed by the drying of said film under conditions which ensure that the dry film is of surface homogeneity, surface integrity, a desired thickness, transparency at the UV region and of other chemical, mechanical and physical measurable characteristics. The film characteristics may be determined prior to application onto the flexographic surface. As the cost associated with the film formation on the sacrificial surface is substantially lower in comparison to the coated flexographic plate, defected films may be discarded.

Typically, the wet film formed on the sacrificial substrate is dried under elevated temperatures ranging from 45 to 190° C., e.g., by hot air or in a hot oven. The wet film may alternatively or additionally be exposed to actinic radiation, e.g., infra red radiation.

The solid material film which forms after application of the formulation on top of the sacrificial substrate is typically 1 to 25 microns in thickness. The film is additionally uniform, homogeneous, non-crystalline, transparent to UV light, of uniform thickness, have no pin-holes or other defects and causes no scattering of light. This film is ink receptive.

The sacrificial polymeric substrate is selected to be smooth, stand the drying process with no physical distortion, and is of a material which does not in any way undergo interaction with the coated material, either when first applied wet, at the drying state or during the dry transfer of the ink receptive coated layer from the sacrificial substrate onto the flexographic plate surface. The sacrificial polymeric substrate is also selected amongst such materials which demonstrate release properties that enable the coated layer (the ink receptive solid material film) to be transferred to the flexographic surface. Such release properties are the adhesion characteristic embodied by Eq. 1 above.

In some embodiments, the sacrificial polymeric substrate is of a material selected from polyester (polyethylene terephtalate, PET), polypropylene (PP), bi-oriented polypropylene (BOPP), polyethylene (PE), ethylenevinyl acetate (EVA), Nylon, polyamide, polyvinyl chloride (PVC), polyvinyl alcohol, polystyrene, a bio-degradable polymeric material e.g. PLA (poly-lactic-acid), polyimide (Kapton), polyether etherketone (PEEK), polycarbonate, polyethylene naphthalate (PEN), polytetrafluoroethylene (Teflon) and combinations thereof.

In some embodiments, said combination of polymeric materials being co-extrusion polymer blends of any two polymers as recited herein. The sacrificial substrate may also be selected to be of low surface energy, e.g. made of polytetrafluoroethylene (Teflon), silicone-coated substrates, fluorosilicone coated substrates and others, enabling the easy transfer of the coated layer from the sacrificial layer onto the flexographic plate.

In some embodiments, the sacrificial layer material is coated with a releasing material having a low surface energy. In some embodiments, the surface energy is 36 dyne/cm or less.

As noted above, for an effective transfer of the ink receptive solid material film onto the flexographic plate, the peeling force characterizing the adhesion of the ink receptive solid material to the sacrificial surface and eventually to the flexographic material are selected such that, in some embodiments, the solid material has a peeling force characterized by Eq. 1:

$$\frac{\text{adhesion of the solid film to the flexographic surface}}{\text{adhesion of the solid film to the sacrificial surface}} > 3 \quad \text{Eq. 1}$$

and wherein the delmination force associated with delaminating the flexographic surface is larger than the adhesion of the ink receptive solid material film to the sacrificial surface.

The sacrificial polymeric substrate might be used as such or may be pre-coated with an additional layer, being a release layer, prior to coating with the required coated layer, to enable easier release (peeling off) of the solid material film during the transfer step from the sacrificial sheet onto the photopolymeric surface. Non-limiting examples of such release materials include silicone-based polymers, fluoro-polymers, polypropylene coated substrates, polyethylene coated substrates and others.

The sacrificial substrate may be coated with the liquid formulation by employing any coating process known in the art, e.g. roll coating, spray coating, knife coating, anilox or gravure coating, metering blade coating, reverse roll, web coating, metering rod coating, slot die coating, curtain coating, air knife coating or any other method known in the art.

The liquid formulation, which is applied onto the sacrificial substrate, comprises a selection of materials which are selected to be compatible with the flexographic material surface, on top of which the dry solid film is to be formed. Additionally, the liquid formulation comprises a selection of materials which enable the chemical reaction of the ink-jet ink droplet, preferably instantaneous reaction, upon its landing on top of the layer. The materials comprising the liquid formulation include, among others, inorganic salts and organic polymers, e.g., which are capable of forming a continuous dry film which is homogenous and of a desired surface integrity and thickness. The inorganic and organic components are additionally selected to interact, chemically or physically, with an ink-jet ink formulation which would subsequently be laid on its surface, the reaction (preferably chemical) ensuring that none of the undesired effects, such as clustering, bleeding or spreading of the ink, occur.

The liquid formulation also comprises at least one additive material selected to enable transfer of the solid film from the sacrificial substrate onto the flexographic plate surface. The at least one additive material so selected may be any one or more of the following:

1. A wetting agent which would allow wetting of the sacrificial substrate, to minimize its surface energy and ease of transfer of the solid film from the sacrificial substrate to said flexographic surface. In some embodiments, the at least one wetting agent is selected amongst fluoro-containing surfactants.

2. A polymeric material which upon absorption of a small amount of water becomes tacky and enables the adherence of the solid film onto the flexographic plate surface. Water might be absorbed by the coating layer during the transfer process, from the water already incorporated in water-washable flexographic plates (Examples 1, 2 and 3 demonstrate this mechanism of dry transfer of the coated film).

3. A reactive material which may be swelled by the flexographic top layer, causing the layer to become tacky and ensure the transfer of the coated layer from the sacrificial substrate onto the flexographic plate surface (Example 17).

4. A thermosensitive polymeric material which upon exposure to an elevated temperature, during the transfer of the solid film from the sacrificial sheet onto the flexographic plate surface, partially or fully melts to enable the transfer of the solid film onto the flexographic plate surface (Example 8 and 10).

5. A high boiling point liquid which keeps the dry film tacky post the drying process and will keep the layer tacky enough to enable transfer of the film onto the flexographic plate. Example 10 demonstrates the effect of the high boiling point material.

Once the dry solid film has been formed on the sacrificial substrate it is ready to be transferred to the flexographic plate and subsequently to be printed on (ink receptive). Following peeling off of the protective layer typically found on the surface of flexographic plates, and peeling off the protective layer which, optionally, is found on top of the ink receptive solid film (being on top of the sacrificial sheet), the solid film is placed onto the flexographic surface with the sacrificial substrate facing away from the flexographic plate, forming a sandwich-like structure, as demonstrated in FIGS. 1 and 2 (structures 100 and 200, respectively). As depicted in FIG. 1B, showing a cross-sectional view of the coating depicted in FIG. 1A, the flexographic plate 102 is covered, on a region thereof, (equivalently relevant to cases where the full surface of the plate is covered) with the ink receptive solid material film 104 such that the flexographic plate 102 is on one side of the solid material film 104, and the sacrificial substrate 106 is on the other side of the solid film 104, thereby forming a layered structure. In such a layered structure (as well as in other layered structures wherein, e.g., the flexographic plate is entirely covered by the solid material film), the flexographic plate 102 is in contact with a first face of the solid film 104 (being the face which adheres to the flexographic plate), while the sacrificial surface 106 is in contact with the second face of the solid film 104 (being the face which is adhered to the sacrificial surface). The ink receptive solid film is allowed to cover the region of the flexographic plate, and both plates are treated by one or more of heat and pressure to cause full adherence and subsequently transfer of the solid film from the sacrificial substrate to the flexographic plate.

Thus, in another aspect of the invention, there is provided a layered structure 100 (laminate), such as that depicted in FIG. 1, comprising a sheet of a polymeric material (the sacrificial substrate) 106, an ink receptive solid film 104 and a flexographic material sheet 102, wherein the sheet of a polymeric material is in direct adhering contact to one face of the solid film and the flexographic material sheet being in direct adhering contact to another face of the solid film, wherein the solid film, and sheets are as defined hereinabove.

In another aspect of the invention, there is provided a flexographic plate coated (laminated) on at least a region of its surface with an ink receptive solid film.

In a further aspect of the present invention, there is provided a solid film formulation comprising:

a) at least one agent selected from a multi-valent salt, an acid, an acidic buffer solution and a poly-cationic polymer;
b) at least one wetting agent;
c) optionally at least one anti-crystallization agent;
d) optionally at least one plasticizer; and
e) optionally at least one additive selected from a penetrating agent, a humectant and a bactericide;
f) at least one material selected to enable transfer of the solid film onto the flexographic plate surface; and
g) optionally at least one water swelling agent said formulation being suitable for use in a method according to the present invention.

In some embodiments, the liquid formulation is for coating a polymeric sacrificial sheet surface. In some embodiments, coating of the sacrificial sheet is performed by means of spraying, brushing or dipping. In some other embodiments, the coating is by direct printing.

In accordance with the present invention, the formulation for use in coating the sacrificial sheet surface is prepared by dissolving in an aqueous media or an organic solvent medium:

a) at least one agent selected from a multi-valent salt, an acid, an acidic buffer solution and a poly-cationic polymer such as poly(di-allyl-di-methyl-ammonium-chloride) (poly-DADMAC);
b) at least one wetting agent such as Byk 348; BYK 345; Surfynol 485; Tego-Wet 500; Rake type silicone surfactant; ABA type siloxane surfactant; Trisiloxane surfactant; fluoro surfactants; and ethoxylated surfactants.
c) optionally at least one anti-crystallization agent selected from: a) a water soluble poly(DADMAC); polyvinylalcohol; polyvinylpyrolidone; and b) a butanol soluble polyvinylpyrolidone; and/or poly(vinylbutyral-co-vinylalcohol-co-vinylacetate);
d) optionally at least one plasticizer;
e) optionally at least one penetrating agent;
f) optionally at least one bactericide; and
g) optionally at least one material selected to enable transfer of the solid film onto the flexographic plate surface.

Without being bound by theory, the agent selected from a multi-valent salt, an acid, an acidic buffer solution and poly-cationic polymer, assists in the immobilization of the ink droplets which are to be deposited on the surface of the solid material film. Non-limiting examples of said multi-valent salt are bi-valent cations such as calcium, magnesium, ferrous, cupric, cobalt, nickel and zinc, in combination with any anion which provides sufficient solubility of the salt; tri-valent ions are, ferric, and cobalt ions.

Non-limiting examples of said acid are weak organic acids, e.g. citric acid or salts thereof which upon dissolution in an aqueous medium will demonstrate a pH lower than 5.5. Buffer solutions which demonstrate a pH value lower than 5.5 might be used as well.

Non-limiting example of said poly-cationic polymer selected from polyethyleneimine and poly(di-allyl-di-methyl-ammonium-chloride).

Without being bound by theory, the salt combination employed in the process of the invention is selected to prevent crystallization thereof on the surface of the sacrificial substrate, as well as the flexographic plate, and to consequently prevent scattering of the UV light which may bring about deterioration in the quality of the image formed on the photopolymeric layer and the flexographic plate quality. To eliminate light scattering it is essential also to employ salt mixtures which, upon drying, form a fully UV transparent salt layer. A combination of at least two salts having the same cation, two or more salts having a common anion or two or more different salts may be used to provide a dry layer exhibiting the required transparency to UV light.

Without being bound by theory, wetting agents are added to the coating formulation to modify (increase) the wettability power of the aqueous solution when applied onto the sacrificial substrate. The wetting agents used may be commercially available and are typically selected to bring the surface tension of the coating solution down to about 20-45 dyne/cm. Non-limiting examples of such wetting agents are those available, for example from BYK corporation, Tego, Air Products and others known to suppliers in the field.

Without being bound by theory, anti-crystallization agents eliminate salt crystallization on top of the sacrificial substrate, thus eliminating UV light scattering and providing the required transparency to UV light (typically in the wavelengths of 150-400 nm). Hence, the coating formulations both wet and upon drying, form a uniform non-crystalline transparent film on top of the sacrificial substrate as well as on top of the photopolymeric surface which does not absorb or scatter any of the UV light.

Without being bound by theory, a plasticizer might be added to avoid cracking of the solid material film and enable high quality image on top of the photopolymeric surface. Non-limiting examples of such plasticizers are selected from poly-ethylene-glycol having a molecular weight of 400 g/mole, poly-ethylene-glycol having a molecular weight of 600 g/mole, poly-propylene-glycol having molecular weight of 725 g/mole, poly-propylene-glycol having molecular weight 1000 g/mole and glycerol. In some embodiments, the at least one plasticizer is miscible with the formulation.

Addition of bactericides, e.g., in an amount of 0.1-1% is optional to prevent growth of bacteria in the aqueous solution during its shelf life.

In some embodiments, the process further comprises ink-jet printing a plurality of ink droplets onto said solid material film (coating) formed on at least a region of said flexographic surface or photopolymeric surface, thereby forming an imaged pattern on said solid material coating. The ink material is selected such that when the ink-jet bi-component ink material droplets contact the solid material, an instantaneous chemical reaction occurs, which results in the immobilization (fixation or freezing) of the ink material droplets on said coating. Thereby, an integrated, high quality UV photo mask image, suitable for forming a high quality image on the photopolymeric plate is obtained.

As used herein, the term "immobilization" or any lingual variation thereof, as well as the interchangeably equivalent terms "freeze" and "fix" or any lingual variations thereof are used to denote the instantaneous fixation of the ink-droplet on its landing site on the solid film. The fixation of the droplet, which may result from a chemical or a physical interaction with the solid film, may be measured, e.g., by determining the expansion of the ink-droplet after it has landed on the film over time or by the deviation from a uniform circular dot.

Without wishing to be bound by theory, the immobilization of the ink-droplet on the surface of the film may result from an interaction between the ink-droplet and the material of the film, said interaction being a chemical reaction or a physical interaction or a combination of the two. The interaction may be one or more of solvation, dissolution, gelation, coordination, complexation, electrostatic interaction, acid-base, ionic, covalent, surface interactions, etc. In some embodiments, the immobilization is due to increased viscosity of the ink-droplet upon landing on the solid film.

Where the ink comprises at least one UV absorbing material, the immediate immobilization (freezing) of the ink-droplet permits fixation of the droplet in a desired pattern, to form an image having UV absorbing regions (the patterned regions covered with the ink) and regions transparent to UV (photosensitive regions not covered by ink and forming the boundaries of the ink pattern). Upon exposure to actinic radiation, only the photosensitive regions undergo a chemical change while the photopolymer which underlies the UV absorbing regions remains unaffected.

In some embodiments, the ink formulation comprises at least one first material which upon contact with at least one second material, not contained in said ink formulation, produces a UV absorbing material. The at least one first and said at least one second materials are typically not UV absorbing.

The at least one second material is typically at least one material comprised in the solid film. Upon application (printing) of the ink formulation comprising the at least one first material onto the solid film, an interaction ensues between said at least one first material and said at least one second material, producing a product which is UV absorbing. In some embodiments, the interaction permits also instantaneous immobilization of the ink-droplet to the film.

In some embodiments, said at least one first material is selected from a material capable of interacting with said at least one second material. Generally, the at least one first material is selected amongst a metal salt, Catechol and mixtures thereof. In some embodiments, the metal salt is selected from a cobalt salt, a plumbum salt, a potassium salt, a silver salt and mixtures thereof.

In some embodiments, the cobalt salt is cobalt acetate.

In some other embodiments, the plumbum salt is selected from lead acetate, lead nitrate, lead bromide and mixtures thereof.

Yet in further embodiments, the potassium salt is selected from potassium iodide, potassium thiocyanate, potassium hexacyanoferrate (II), potassium hexacyanoferrate (III) and mixtures thereof.

The silver salt is selected from silver nitrate or silver fluoride.

In some embodiments, said at least one second material is selected from ammonium thioglycolate, cysteine, sodium sulfide, a multi-valent metal ion salt and a mixture thereof.

In some embodiments, the multi-valent metal ion salt is a bi-valent metal ion salt, being selected, in a non-limiting fashion, from a ferrous ion (e.g., ferrous sulfate), a cupric ion (e.g., cupric sulfate), a zinc ion (e.g., zinc nitrate), a calcium ion (e.g., calcium acetate) and a magnesium ion (e.g., magnesium chloride).

In other embodiments, the multi-valent metal ion salt is a tri-valent metal ion salt, being selected from ferric ions (e.g., ferric sulfate).

In some embodiments, the second material is soluble in an aqueous solution. In other embodiments, the second material is soluble in a non-aqueous solution. The non-aqueous solution may be selected from an alcohol of different chain lengths (e.g. methanol, ethanol, propanol, butanol, etc), a glycol (e.g., ethylene glycols, propylene glycols) and glycol ether (e.g., diethylene-glycol-mono-butyl-ether, diethylene-glycol-mono-ethyl-ether).

In a further aspect of the present invention there is provided a process comprising:
a) forming a solid film on a flexographic plate surface, in accordance with the present invention (i.e., by employing a solvent-free transfer of a solid film from a sacrificial substrate to a flexographic plate); and
b) printing on said film a bi-component ink formulation, to thereby form a pattern, e.g., UV-absorbing pattern, on the photopolymeric film surface; form an etch mask on top of e.g. PCB (printed circuit board); or a print on top of paper or vinyl substrate.

In some embodiments, the process comprising:
a) providing a flexographic plate;
b) forming a solid film on said flexographic plate surface, in accordance with the present invention (i.e., by employing a solvent-free transfer of a solid film from a sacrificial surface to a flexographic plate); and
c) direct printing on the film at least one ink being UV-absorbing or comprising at least one UV absorbing material, to thereby form a UV-absorbing pattern on the surface.

In some further embodiments, the flexographic plate surface is provided pre-made with a solid film thereon.

In another aspect of the present invention, there is provided a process for producing an image on a surface, e.g., a flexographic surface, said process comprising providing a surface coated with a solid film in accordance with the present invention, and direct printing on said solid film a pattern of at least one ink, said ink comprising at least one first material which upon contact with at least one second material comprised in said solid film, produces a UV absorbing material, thereby forming a UV absorbing pattern on top of said surface.

In some embodiments, said surface is any surface on which the solid film may be transformed in accordance with the process of the invention. In some embodiments, the surface may be a glass surface, a cardboard surface, a metallic surface, a polymeric surface, a PCB (Printed Circuit Board) surface, etc. In some embodiments, said surface is a polymeric surface. In other embodiments, said surface is a photopolymeric surface, e.g., a flexographic surface.

In some embodiments, said direct printing is by ink-jet printing.

In a further aspect of the present invention, there is provided a photomask comprising at least one region of a UV absorbing material produced on a solid surface manufactured as disclosed herein.

In another aspect of the present invention there is provided a process comprising:
 a) forming a solid film on a sacrificial surface, in accordance with the present invention;
 b) printing a bi-component ink formulation on said film, the film being on the sacrificial surface; and
 c) transferring said printed film onto a region of a flexographic plate surface, in accordance with the present invention;
to thereby form a pattern, e.g., UV-absorbing pattern, on the flexographic film surface.

In a further aspect of the present invention there is provided a process comprising:
 a) forming a solid film on a sacrificial surface, in accordance with the present invention, the solid film having a first face and a second face;
 b) bringing into contact at least a region of a flexographic material surface and the first face of said solid material film; and
 c) permitting adhesion of said solid material film to said at least a region of the flexographic surface, such that the sacrificial surface (sheet) is in direct adhering contact to the second face of the solid material film and the flexographic material surface being in direct adhering operative contact to the first face of the solid film,
 d) peeling off the sacrificial surface to obtain a flexographic surface coated with said solid material film; and
 e) printing a bi-component ink formulation onto a region of the solid film to thereby form a pattern, e.g., UV-absorbing pattern, on the flexographic film surface.

BRIEF DESCRIPTION OF THE FIGURES

In order to understand the invention and to see how it may be carried out in practice, embodiments will now be described, by way of non-limiting example only, with reference to the accompanying drawings, in which:

FIG. 1A depicts a side view of a flexographic plate covered on a region thereof with an ink receptive solid film; FIG. 1B depicts a cross-sectional view of the structure of FIG. 1A along the line I-I.

DETAILED DESCRIPTION OF EMBODIMENTS

Figure 1A:
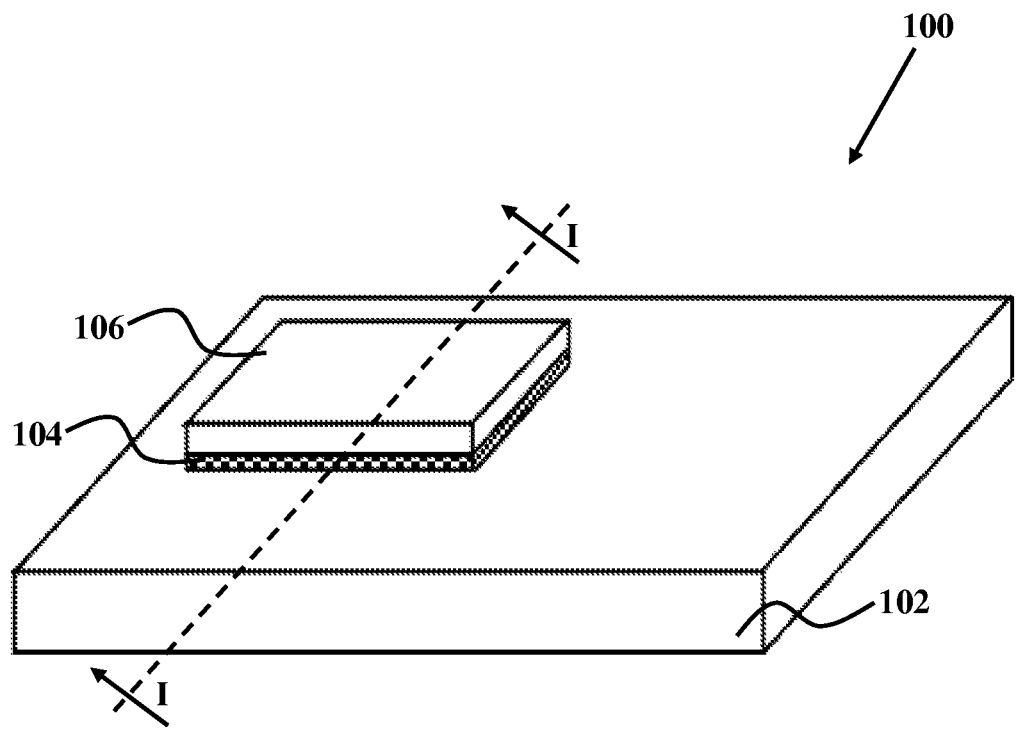
FIGS. 1A and 1B depict an embodiment structure according to the invention.
Figure 1B:
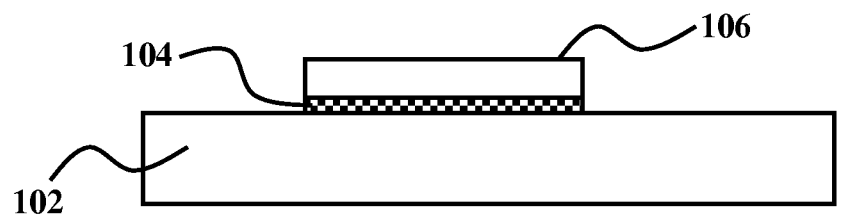
Figure 2:
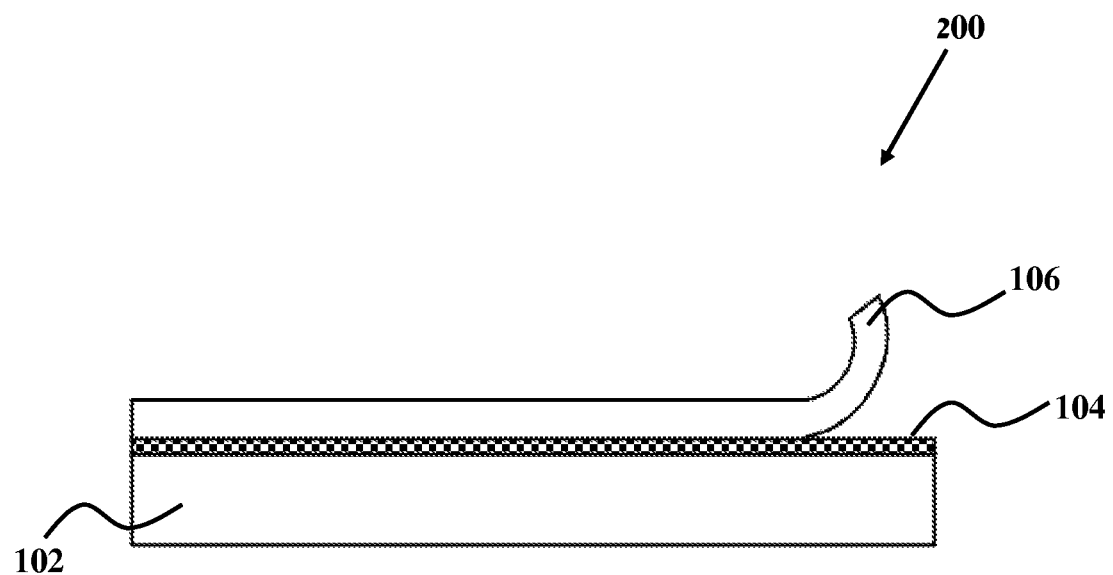
FIG. 2 depicts a flexographic plate covered with an ink receptive solid material film, partially exposed, upon peeling off of the sacrificial surface.

As stated hereinabove, the present invention provides an alternative to the currently available wet processes for coating flexographic plates. The process of the present invention, which enables the transfer of a dry coat onto such surfaces, dramatically improves and diminishes well known deficiencies associated with such wet-coating technologies.

The most known digital in-situ mask making approach, which has become a major trend in the industry and is widely commercialized, is the computer-to-plate (CTP) technology which employs laser ablation. In this method, the photopolymer top surface is incorporated with a UV opaque/absorbed layer, which is also IR sensitive/ablate-able. The layer is image-wise ablated/burned off and removed by the IR laser, finally producing an image-wise UV mask. The plate then undergoes the traditional process of UV exposure and development in order to obtain a finished flexo printing plate to be subsequently mounted on the press.

Although the CTP process provides high plate and print quality, improved make-ready time and saving some of the traditional steps and devices, the process is considered a slow process which requires an expensive imaging plate setter device and a special plate.

Another method currently used is the direct engraving method, in which the flexographic plate is not composed of a photopolymeric material and is engraved to the final required shape by using a high density laser beam. The engraving process is typically lengthy, accompanied by high costs of the plate material and a high risk of scrap caused by engraving errors.

A relatively new and attractive approach is the utilization of an ink-jet method to produce/apply an image UV mask directly on the flexo photopolymer plate surface by image wise, digitally controlled ejection/dispensing drops flood. While this approach provides a simple, fast and cost effective solution, the ink jet technology is limited to using a very low viscosity liquid ink formulation, typically 3-20 cPs.

When ink drops land and come into direct contact with the substrate/photopolymer surface, phenomena such as: bleeding, clustering, feathering of droplets, extensive dot gain and density deterioration (UV image mask absorption) come into play. Additionally, while applying a water-based ink directly on a water washable plate, an uncontrolled development/etching action commences which negatively affects the plate quality. The deficiencies result in a reduced resolution, lack of details, very limited gray level latitude, lack of image consistency and control, UV exposure stability and control; thus resulting in deterioration of the print which is a major obstacle to high image quality.

The technological solution to overcome these problems is to apply a "freezing" mechanism that enables instantaneous drop fixation upon contact with the plate surface. This eliminates the limitations and enables achieving the required UV mask, plate and print quality.

Two different approaches have been suggested as means of drop freezing: (a) a mechanism based on physical absorption/evaporation; and (b) being based on a two-component chemical reaction mechanism.

In the physical absorption mechanism, the polymer top surface is coated with a chemical substance layer, which absorbs the ink droplet, thus leaving behind a 'dry' layer. This minimizing drop deformation/alternation and provides high quality results [1,2,3].

The solution provided by [1] involves the addition of an intermediate peelable layer, having a good retention to both sides, bottom side (polymer plate surface) and upper side (ink receiving layer). After UV exposure and prior to the development stage, the peelable layer may be peeled off together with the mask layer.

In publication [2] the solution is to peel off and remove the second plate protection barrier (the polyamide barrier layer foil), and then attach the ink receptive coating directly onto the bare photopolymer substance. Absorbent fixation mechanism is also sensitive to the surrounding environment, such as humidity and temperature, therefore, tight coating process and storage control are required. In addition, in order to achieve a good and reliable drop fixation, the thickness of the ink receiving coating must be relatively thick, being in the range of 10-15 micron.

As already mentioned hereinabove, a different approach to achieving a high quality mask and printing is by employing the two-component chemical reaction "freezing" method, in which the top surface of the photopolymer flexo plate (after removing the top physical protection layer) is coated with a thin chemically reactive layer (typically of 1-5 micron) of one element reactant substance. While "ink" droplets, as the second chemical element, hit and come into contact with this reactant, an instantaneous chemical reaction occurs, which results in ink droplet fixation and immobilization of the droplet on the photopolymer plate surface. The end outcome of the above process is an integrated, high quality UV photo mask, which leads to high quality image on the photopolymeric plate. However, even with this process, some deficiencies are noted which affect the quality, reliability, the environment and the associated overall cost.

Thus, it is the purpose of the present invention to provide a superior process to the currently employed wet-coating process of flexographic plates, to enable imaging of the plates by using ink-jet technology and a bi-component ink approach. As noted above, the process of the present invention, which enables the transfer of a dry coat onto such surfaces, dramatically improves the overall mask/plate/print quality on a variety of plate sizes and plate materials, increases machine reliability, reduces machine costs, simplifies maintenance, enables cost effective short runs, and thereby minimizes VOC emission and may thus be regarded environmentally friendly.

Aspects of the invention relate to a dry, solvent free, process for the transfer of a solid material film to at least a region of a flexographic material surface, to thereby form a coat (film) of the solid material on a region of said flexographic material surface are demonstrated by the following non-limiting examples.

In the following Examples, Examples 1, 2 and 3 provide formulations typically used in wet-coating techniques for directly forming a film onto flexographic plates. Examples 4 to 9 are provided as exemplary embodiments of formulations according to the present invention, for use in a dry solvent-free coating process according to the invention.

As may be appreciated, the formulations of the invention (exemplified in Examples 4 to 9) contain a material which will enable the required transfer from the sacrificial substrate onto the flexographic plate. When a formulation in accordance with Example 2 was used in a process according to the present invention, transfer of a dry film from a sacrificial surface to a flexographic surface could not be achieved. This may be attributed to the lack of a proper compound which will enable the transfer of the dry film from the sacrificial substrate onto the flexographic plate. Adding a transfer enabling material to the same formulation (as demonstrated in Example 10) permitted the transfer of the dry film onto the flexographic plate.

Example 1

(Reference Wet-Coating): Water Washable Flexographic Plate

A commercially available water-washable photopolymeric plate Torelief WF80DHX4, made by Toray (Letter Press Plate) was coated with 100 micrometers of the following solution:
5% polyethyloxasoline;
25% poly(1-vinylpyroldone-2-dimethylmethacrylate) aqueous solution (20%);
1.5% calcium nitrate tetrahydrate;
0.1% wetting agent; and
68.4% ethyl lactate as solvent.

Coating was carried out using a K Hand coating bar which applied a wet layer of the solution in a thickness of approximately 100 micrometers. The plate was dried using a hot air blower; air temperature was 65° C. for a few minutes to fully dry the plate.

Imaging of the UV absorbing layer was done using an Epson Stylus Pro 4880 printer, using a 2880X1440 dpi resolution.

Ink used was composed of:
72% mixture of black, yellow and cyan dyes aqueous solutions;
1.4% polystyreneacrylic polymer, Mw of 1,000-15,000 g/mole;
0.5% wetting agent;
5% glycerol;
10% propylene glycol; and
11.1% water.

The plate was dried post-printing using a hot air blower, air temperature was 65° C. Dry plate was exposed to UV light for 180 seconds, using Philips UV lamps. Plates were washed out in a water bath and brushed, followed by drying of the plate.

Plate quality was good and was used on a flexo press machine.

Example 2

(Reference Wet-Coating): Solvent Washable Flexographic Plate

A commercially available solvent-washable photopolymeric plate Nyloflex FAH 170 made by Flint (Flexo Plate) was coated with a 100 micrometers of a solution composed of:
10% polyvinyl-alcohol;
5% calcium nitrate tetra-hydrate;
0.5% Byk 333 wetting agent; and
84.5% water.

Coating was carried out using a K Hand coating bar which applies a wet layer of 100 micrometers.

The plate was dried using a hot air blower; air temperature was 65° C. for a few minutes to fully dry the plate. Imaging of the UV absorbing layer was done using an Epson Stylus Pro 4880 printer, using a 2880X1440 dpi resolution.

Ink used was composed of:
72% mixture of black, yellow and cyan dyes aqueous solutions;
1.4% poly styrene-acrylic polymer, Mw of 1,000-15,000 g/mole;
0.5% wetting agent;
5% glycerol;
10% propylene glycol; and
11.1% water.

The plate was dried post printing using a hot air blower; air temperature was 65° C. Dry plate was exposed to UV light for 40 seconds at the back, using Philips UV lamps and 900 sec at the front. Plates were washed out using a solvent washing unit, followed by drying of the plate.

Plate quality was good and was used on a flexo press machine.

Example 3

(Reference Wet-Coating): Universal Coating, for Both Water Washable and Solvent Washable Plates The following coating composition was used to coat both types of plates: water washable plates as well as solvent washable plates.

Coating was applied at thicknesses ranging from 60 micrometers up to 120 micrometers, using the following composition:
27% aqueous solution (20%) poly(diallyl-dimethyl ammonium chloride);
15% poly(1-vinylpyroldone-2-dimethylmethacrylate) aqueous solution (20%);
5% zinc acetate;
0.2% wetting agent; and
52.8% propylene glycol.

Coating of both types of plates was carried out using a K Hand coating bar which applies a wet layer of between 60 and 120 micrometers.

Drying of the plates using hot air at 65° C. for several hours did not result in complete drying of the plates. In order to fully dry the plate, an IR radiation drying technology was required. This drying technology brought the plate temperature up to 140° C. and caused severe damage to the plates.

The plates could not be further processed.

Example 4

Coating a Torelief WF80DHX4 Flexo Plate

A 100-micrometer thick polyester (PET) sacrificial sheet was coated with 100 micrometers of the following solution:
5% polyvinyl alcohol;
25% poly(1-vinylpyroldone-2-dimethylmethacrylate) aqueous solution (20%);
1.5% calcium nitrate tetrahydrate;
0.1% wetting agent; and
68.4% water.

Coating was done using a K Hand coating bar which applies a wet layer of 100 micrometers.

The polyester sheet was dried using a hot air blower; air temperature was 65° C. for few minutes to fully dry the plate. The coated sheet was placed on top of a commercially available water-washable photopolymeric plate, Torelief WF80DHX4, made by Toray (Letter Press Plate)—coating facing the top layer of the plate.

An external pressure was applied to the sheet and plate via a metal cylinder weighing 20 kg (applying a load of about 1 kg/cm$^2$). The coating was transferred from the PET onto the photopolymeric plate.

Imaging of the UV absorption layer was done using an Epson Stylus Pro 4880 printer at 2880X1440 dpi resolution.

The coated plate was imaged as described in Examples 1 to 3 above.

The plate was dried post printing using a hot air blower; air temperature was 65° C.

Dry plates were exposed to UV light for 180 seconds, using Philips 40 WR UV lamps. Plates were washed out using a water bath and brushing, followed by drying of the plate.

Plate quality was good and was used on a flexo press machine.

Example 5

Coating JetEurope LSL073SB Flexo Plate

A 100-micrometer thick polyester (PET) sacrificial sheet was coated with 100 micrometers of the following solution:
5% polyvinyl alcohol;
25% poly(1-vinylpyroldone-2-dimethylmethacrylate) aqueous solution (20%);
1.5% zinc acetate;
0.1% wetting agent; and
68.4% water.

Coating was carried out using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate JetEurope LSL073SB, made by Jet Europe (Letter Press Plate)—coating facing the top layer of the plate. A commercially available Laminator was used at wheels' temperature of 60° C. for the film transfer to the plate.

The coating was transferred from the PET onto the photopolymeric plate. The coated plate was imaged as described in Examples 1-3.

The plate was dried post printing using a hot air blower; air temperature was 65° C. Dry plate was exposed to UV light for 180 seconds, using Philips UV lamps.

Plates were washed out using water bath and brushing, followed by drying of the plate.

Plate quality was good and was used on a flexo press machine.

Example 6

Coating a Miraclon B170F Flexo Plate

A 100-micrometer thick polyester (PET) sacrificial sheet was coated with 100 micrometers of the following solution:
5% polyvinyl alcohol;
25% poly(1-vinylpyroldone-2-dimethylmethacrylate) aqueous solution (20%);
1.5% zinc acetate;
0.1% wetting agent; and
68.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Miraclon B170F, made by Tokyo Ohka Kogyo Co. (Water-Flexo Plate), coating facing the top layer of the plate. A commercially available Laminator was used at wheels temperature of 60° C. for the film transfer to the plate. The coating was transferred from the PET onto the photopolymeric plate.

The coated plate was imaged as described in Examples 1.

The plate was dried post printing using a hot air blower, air temperature was 65° C.

Dry plate was exposed to UV light for 120 seconds at its back side and for extra 240 sec at its front side, using Philips UV lamps. Plates were washed out using water bath and brushing, followed by drying of the plate.

Plate quality was good and was used on a flexo press machine.

Example 7

Coating a Now45 Flexo Plate

A 100-micrometer thick polyester (PET) sacrificial sheet was coated with 100 micrometers of the following solution:
- 5% polyvinyl alcohol;
- 25% poly(1-vinylpyroldone-2-dimethylmethacrylate) aqueous solution (20%);
- 1.5% zinc acetate;
- 0.1% wetting agent; and
- 68.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available flexo solvent-washable photopolymeric plate Now45, made by DuPont (solvent-Flexo Plate)—coating facing the top layer of the plate. A commercially available Laminator was used—at wheels temperature of 60° C. for the film transfer to the plate.

The coating could not be transferred from the PET onto the photopolymeric plate, unless a temperature of 160° C. was used—a temperature which was damaging to the plate.

Example 8

Sacrificial Sheet with High Boiling Liquid

A 75-micrometer thick polyester (PET) sacrificial sheet was coated with 80 micrometers of the following solution:
- 3.0% polyvinylpyrrolidone K90 (ISP);
- 8.0% viviprint 200 (ISP) (30%);
- 0.4% calcium acetate hydrate;
- 0.3% polyethylene glycol 400;
- 0.9% polyethylene glycol 600;
- 0.3% wetting agent; and
- 87.0% water.

Coating was done using a K Hand coating bar which applies a wet layer of 80 micrometers.

The polyester sheet was dried using an oven; air temperature was 100° C. for two minutes to fully dry the plate. The coated sheet was placed on top of a commercially available solvent-washable photopolymeric plate, ACE114, made by Flint (Flexo Plate)—coating facing the top layer of the plate.

Example 9

Coating a Printigth GC95LF Flexo Plate

A 100-micrometer thick polyester (PET) sacrificial sheet was coated with a 100 micrometers of the following solution:
- 2% polyvinyl alcohol;
- 10% poly(1-vinylpyroldone-2-dimethyl methacrylate) aqueous solution (20%);
- 1% calcium nitrate tetrahydrate;
- 1% glycerol;
- 0.1% wetting agent; and
- 85.9% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Printigth GC95LF, made by Toyobo (Letter Press Plate)—coating facing the top layer of the plate. A commercially available Laminator was used at wheels temperature of 60° C. for the film transfer to the plate.

The coating was transferred from the PET onto the photopolymeric plate.

The coated plate was imaged as described in Examples 1-3.

The plate was dried post printing using a hot air blower; air temperature was 65° C.

Dry plate was exposed to UV light for 180 seconds, using Philips UV lamps.

Plates were washed out using water bath and brushing, followed by drying of the plate.

Plate quality was good and was used on a flexo press machine.

Example 10

Coating a Printigth BF95GB Flexo Plate

A 100-micrometer thick polyester (PET) sacrificial sheet was coated with a 100 micrometers of the following solution:
- 0.6% polyvinyl alcohol;
- 6% poly(1-vinylpyroldone-2-dimethyl methacrylate) aqueous solution (20%);
- 0.2% calcium nitrate tetrahydrate;
- 0.6% polyethyl oxazoline;
- 0.8% polyvinylpyrrolidone;
- 1% glycerol;
- 0.1% wetting agent; and
- 90.7% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Printigth BF95GB, made by Toyobo (Letter Press Plate)—coating facing the top layer of the plate. A commercially available Laminator was used at wheels temperature of 60° C. for the film transfer to the plate.

The coating was transferred from the PET onto the photopolymeric plate.

The coated plate was imaged as described in Examples 1-3.

The plate was dried post printing using a hot air blower; air temperature was 65° C.

Dry plate was exposed to UV light for 180 seconds, using Philips UV lamps.

Plates were washed out using water bath and brushing, followed by drying of the plate.

Plate quality was good and was used on a flexo press machine.

Example 11

Coating a Printigth KM95AR Flexo Plate

A 100-micrometer polyester (PET) sacrificial sheet was coated with a 100 micrometers of the following solution:
- 0.6% polyvinyl alcohol;
- 4% poly(1-vinylpyroldone-2-dimethyl methacrylate) aqueous solution (20%);
- 1.1% zinc acetate;

1.5% polyvinylpyrrolidone;
1.5% xylitol;
0.1% wetting agent; and
91% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Printigth KM95AR, made by Toyobo (Letter Press Plate)—coating facing the top layer of the plate. A commercially available Laminator was used at wheels temperature of 60° C. for the film transfer to the plate.

The coating was transferred from the PET onto the photopolymeric plate.

The coated plate was imaged as described in Examples 1-3.

The plate was dried post printing using a hot air blower; air temperature was 65° C.

Dry plate was exposed to UV light for 180 seconds, using Philips UV lamps.

Plates were washed out using water bath and brushing, followed by drying of the plate.

Plate quality was good and was used on a flexo press machine.

Example 12

Coating a Printigth EF95GC Flexo Plate

A 100-micrometer thick polyester (PET) sacrificial sheet was coated with a 100 micrometers of the following solution:
5% polyvinylpyrrolidone;
4% polyethylene glycol 400;
1.5% zinc acetate dehydrate;
0.1% wetting agent; and
89.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Printigth EF95GC, made by Jet Europe (Letter Press Plate)—coating facing the top layer of the plate. A commercially available Laminator was used at wheels temperature of 25° C. for the film transfer to the plate.

The coating was transferred from the PET onto the photopolymeric plate.

The coated plate was imaged as described in Examples 1-3.

The plate was dried post printing using a hot air blower; air temperature was 65° C.

Dry plate was exposed to UV light for 180 seconds, using Philips UV lamps.

Plates were washed out using water bath and brushing, followed by drying of the plate.

Plate quality was good and was used on a flexo press machine.

Example 13

Coating a Toyobo Cosmoligth NS170F Flexo Plate

A 100-micrometer thick polyester (PET) sacrificial sheet was coated with a 100 micrometers of the following solution:
8% polyvinyl pyrrolidone;
1.5% polyethylene glycol 400;
1% Calcium acetate hydrate;
0.1% wetting agent; and
89.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate Toyobo Cosmoligth NS170F, made by Toyobo (Flexo Plate)—coating facing the top layer of the plate. A commercially available Laminator was used at wheels temperature of 100° C. for the film transfer to the plate.

The coating was transferred from the PET onto the photopolymeric plate.

The coated plate was imaged as described in Examples 1-3.

The plate was dried post printing using a hot air blower; air temperature was 65° C.

Dry plate was exposed to UV light for 180 seconds, using Philips UV lamps.

Plates were washed out using water bath and brushing, followed by drying of the plate.

Plate quality was good and was used on a flexo press machine.

Example 14

Coating a ACE 170 Flexo Plate

A 100-micrometer thick polyester (PET) sacrificial sheet was coated with a 100 micrometers of the following solution:
8% polyvinylpyrrolidone;
2% polyethylene glycol 200;
1.5% calcium acetate hydrate;
0.1% wetting agent; and
88.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available water-washable photopolymeric plate ACE 170, made by Flint (Flexo solvent plate)—coating facing the top layer of the plate. A commercially available Laminator was used at wheels temperature of 120° C. for the film transfer to the plate.

The coating was transferred from the PET onto the photopolymeric plate.

The coated plate was imaged as described in Examples 1-3.

The plate was dried post printing using a hot air blower; air temperature was 65° C.

The dry plate was exposed to UV light for 180 seconds, using Philips UV lamps.

Plates were washed out using water bath and brushing, followed by drying of the plate.

Plate quality was good and was used on a flexo press machine.

Example 15

Coating a Torelief WF80DHX4 Flexo Plate

A 100-micrometer thick polyester (PET) sacrificial sheet was coated with 100 micrometers of the following solution:
5% polyvinyl alcohol;
25% poly(1-vinylpyroldone-2-dimethylmethacrylate) aqueous solution (20%);

1.5% calcium nitrate tetrahydrate;
0.1% wetting agent; and
68.4% water.

Coating was done using a K Hand coating bar which applies a wet layer of 100 micrometers.

The polyester sheet was dried using a hot air blower; air temperature was 65° C. for few minutes to fully dry the plate.

The coated plate was imaged as described in Examples 1-3 above.

The plate was dried post printing using a hot air blower; air temperature was 65° C.

The coated and printed sheet was placed on top of a commercially available water-washable photopolymeric plate, Torelief WF80DHX4, made by Toray (Letter Press Plate)—coating facing the top layer of the plate.

An external pressure was applied to the sheet and plate via a metal cylinder weighing 20 kg (applying about 1 kg/cm$^2$). The coating and the image were transferred from the PET onto the photopolymeric plate.

Imaging of the UV absorption layer was done using an Epson Stylus Pro 4880 printer at 2880X1440 dpi resolution.

Dry plates were exposed to UV light for 180 seconds, using Philips 40 WR UV lamps. Plates were washed out using a water bath and brushing, followed by drying of the plate.

Plate quality was good and was used on a flexo press machine.

Example 16

Coating a ACE114 Flexo Plate

A 75-micrometer polyester (PET) sacrificial sheet was coated with 80 micrometers of the following solution:
2.7% polyvinylpyrrolidone K90 (ISP);
8.5% viviprint 200 (ISP) (30%);
0.5% calcium acetate hydrate;
0.5% polyethyleneglycol 400;
0.2% wetting agent; and
87.6% water.

Coating was done using a K Hand coating bar which applies a wet layer of 80 micrometer.

The polyester sheet was dried using a oven; air temperature was 100° C. for two minutes to fully dry the plate. The coated sheet was placed on top of a commercially available solvent-washable photopolymeric plate, ACE114, made by Flint (Flexo Plate)—coating facing the top layer of the plate.

Example 17

Sacrificial Sheet with Cyclohexanol (Swelling Mechanism)

A 100-micrometer thick polyester (PET) sacrificial sheet was coated with 100 micrometers of the following solution:
5% polyvinyl alcohol;
25% poly(1-vinylpyroldone-2-dimethyl methacrylate) aqueous solution (20%);
2% cyclohexanol;
1.5% zinc acetate;
0.1% wetting agent; and
66.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available solvent-washable photopolymeric plate Now 45, made by DuPont. A commercially available Laminator was used—at wheels temperature of 60° C. for the film transfer to the plate. The coating was transferred from the PET onto the photopolymeric plate.

The coated plate was imaged as described in Examples 1-3.

The plate was dried post printing using a hot air blower; air temperature was 65° C.

Dry plate was exposed to UV light for 80 seconds at its back side and for extra 900 sec at its front side, using Philips UV lamps. Plates were washed out using water bath and brushing, followed by drying of the plate.

Plate quality was good and was used on a flexo press machine.

Example 18

Sacrificial Sheet with poly(2-ethyl-2-oxazoline) (Hot-Melt Mechanism)

A 100-micrometer thick polyester (PET) sacrificial sheet was coated with 100 micrometers of the following solution:
2.5% polyvinyl alcohol;
12.5% poly(1-vinylpyroldone-2-dimethyl methacrylate) aqueous solution (20%);
5% poly(2-ethyl-2-oxazoline);
1.5% zinc acetate;
0.1% wetting agent; and
78.4% water.

Coating was done using a K Hand coating bar which applies a wet layer of 100 micrometers.

The polyester sheet was dried using a hot air blower; air temperature was 65° C. for few minutes to fully dry the plate.

The coated sheet was placed on top of a commercially available solvent-washable photopolymeric plate Now 45, made by DuPont. A commercially available Laminator was used—at wheels temperature of 90° C. for the film transfer to the plate. The coating was transferred from the PET onto the photopolymeric plate.

The coated plate was imaged as described in Examples 1-3.

The plate was dried post printing using a hot air blower; air temperature was 65° C.

Dry plate was exposed to UV light for 80 seconds at its back side and for extra 900 sec at its front side, using Philips UV lamps. Plates were washed out using water bath and brushing, followed by drying of the plate.

Plate quality was good and was used on a flexo press machine.

The invention claimed is:

1. A process for printing an ink formulation, said process comprising:
   (a) providing an ink receptive solid material film on a sacrificial surface (sheet), the film having a first face and a second face, said second face being covered by said sacrificial surface;
   (b) bringing into contact at least a region of a flexographic material surface with the first face of said ink receptive solid material film;
   (c) permitting adhesion of said ink receptive solid material film to said at least a region of the flexographic surface, such that the sacrificial surface (sheet) is in direct adhering contact to the second face of the ink receptive solid material film and the flexographic material surface being in direct adhering contact to the first face of the solid film;
   (d) peeling off the sacrificial surface to expose said second face of said ink receptive solid material film; and (e) printing said ink formulation onto a region of said second face of said ink receptive solid film to thereby form a pattern on the second face of said ink receptive solid film surface.

2. The process according to claim 1, wherein $$\frac{\text{adhesion of the solid film to the flexographic surface}}{\text{adhesion of the solid film to the sacrificial surface}} > 3.$$

3. The process according to claim 2, wherein the adhesion of the ink receptive solid material film to the sacrificial surface is smaller than delamination forces required for delaminating the flexographic surface.

4. The process according to claim 1, wherein the ink receptive solid material film of step (a) coating a sacrificial surface (sheet) is provided with a protective layer which may remain on the first face of the solid film until the bringing into contact of the at least a region of a flexographic material surface and the first face of said solid material film.

5. The process according to claim 1, wherein the sacrificial surface is a polymeric substrate selected from polyester (polyethylene terephtalate, PET), polypropylene (PP), bi-oriented polypropylene (BOPP), polyethylene (PE), ethylenevinyl acetate (EVA), Nylon, polyamide, polyvinyl chloride (PVC), polyvinyl alcohol, polystyrene, a bio-degradable polymeric material, polyimide (Kapton), polyether etherketone (PEEK), polycarbonate, polyethylene naphthalate (PEN), polytetrafluoroethylene (Teflon), and combinations thereof.

6. The process according to claim 1, wherein printing comprises ink-jet printing of a plurality of ink droplets onto said ink receptive solid material film formed on at least a region of said flexographic surface, thereby forming an imaged pattern on said solid material film.

7. The process according to claim 6, wherein the ink is selected such that when droplets thereof contact said solid material film, a reaction occurs, which results in the immobilization of the ink material droplets on said solid material film.

8. The process according to claim 7, wherein said ink comprises at least one UV absorbing material.

9. The process according to claim 8, wherein the immobilization of the ink containing the at least one UV absorbing material permits formation of an image having UV absorbing regions and regions transparent to UV.

10. The process according to claim 7, wherein the ink comprises at least one first material which upon contact with at least one second material, not contained in said ink, produces a UV absorbing material.

11. The process according to claim 10, wherein the at least one first and said at least one second materials are not UV absorbing.

12. The process according to claim 10, wherein the at least one second material is at least one of the materials comprised in the ink receptive solid film.

13. The process according to claim 1, the process comprising:
a) providing a flexographic plate;
b) forming an ink receptive solid film on said flexographic plate surface, said ink receptive solid film having been prepared by a process comprising forming an ink receptive solid material film on a sacrificial surface (sheet) and transferring said film to at least a region of a flexographic material surface, wherein said transferring is a solvent-free process, to thereby form a pattern on the ink receptive film surface; and
c) direct printing on the ink receptive film at least one ink being UV-absorbing or comprising at least one UV absorbing material,
to thereby form a UV-absorbing pattern on the surface.

14. The process according to claim 1, wherein said process is for producing an image on a surface, said process comprising providing a surface coated with an ink receptive solid film, and direct printing on said solid film a pattern of at least one ink, said ink comprising at least one first material which upon contact with at least one second material comprised in said solid film, produces a UV absorbing material, thereby forming a UV absorbing pattern on top of said surface, wherein the surface coated with an ink receptive solid film is prepared by
a) providing an ink receptive solid material film on a sacrificial surface (sheet), the film having a first face and a second face, said second face being covered by said sacrificial surface;
b) bringing into contact at least a region of a surface and the first face of said solid material film;
c) permitting adhesion of said ink receptive solid material film to said at least a region of the surface, such that the sacrificial surface (sheet) is in direct adhering contact to the second face of the solid material film and the surface being in direct adhering contact to the first face of the solid film; and
d) peeling off the sacrificial surface to expose the second face of said ink receptive solid material film to enable direct printing thereon.

15. A formulation, comprising:
a) at least one agent selected from a multi-valent salt, an acid, an acidic buffer solution, and a poly-cationic polymer;
b) at least one wetting agent;
c) optionally at least one anti-crystallization agent;
d) optionally at least one plasticizer;
e) optionally at least one additive selected from a penetrating agent, a humectant, and a bactericide; and
f) at least one material selected to enable transfer of the solid film onto the flexographic plate surface,
said formulation being suitable for use in coating the sacrificial surface in the process according to claim 1.

* * * * *